United States Patent
Kipp

(10) Patent No.: US 12,007,443 B2
(45) Date of Patent: Jun. 11, 2024

(54) CONTACT ARRANGEMENT HAVING A MEASURING DEVICE FOR DETERMINING A CONTACTING STATE OF THE CONTACT ARRANGEMENT BY MEANS OF AN ACOUSTIC SIGNAL

(71) Applicant: TE Connectivity Germany GmbH, Bensheim (DE)

(72) Inventor: Stefan Kipp, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 17/410,377

(22) Filed: Aug. 24, 2021

(65) Prior Publication Data

US 2022/0057450 A1 Feb. 24, 2022

(30) Foreign Application Priority Data

Aug. 24, 2020 (DE) .......................... 102020122065.0

(51) Int. Cl.
*G01R 31/327* (2006.01)
(52) U.S. Cl.
CPC ................................ *G01R 31/3274* (2013.01)
(58) Field of Classification Search
USPC ....... 324/424, 425, 415, 417, 419, 421, 422, 324/423
See application file for complete search history.

(56) References Cited

U.S. PATENT DOCUMENTS

| | | | |
|---|---|---|---|
| 3,560,844 A | 2/1971 | Brown | |
| 5,566,041 A | 10/1996 | Rumfield | |
| 5,629,864 A | 5/1997 | Noe et al. | |
| 6,936,008 B2 | 8/2005 | Tarakei et al. | |
| 7,786,830 B2 * | 8/2010 | Wakatsuki | H01H 59/0009 335/78 |
| 9,537,277 B2 | 1/2017 | Yost et al. | |
| 10,115,512 B2 | 10/2018 | Koch et al. | |
| 10,509,307 B2 | 12/2019 | Brown et al. | |

(Continued)

FOREIGN PATENT DOCUMENTS

| CN | 201935975 U | 8/2011 |
|---|---|---|
| CN | 104792869 A | 7/2015 |

(Continued)

OTHER PUBLICATIONS

Nishizawa et al. ; Surface Acoustic Wave Device; CN 1956325 B; Date Published May 12, 2010; H 03 H 9/0057 (Year: 2010).*

(Continued)

*Primary Examiner* — Nasima Monsur
(74) *Attorney, Agent, or Firm* — Barley Snyder

(57) ABSTRACT

A contact arrangement includes a first electrical contact, a second electrical contact and a measuring device for determining a contacting state between the first and second contacts. In a first contacting state the first and second contacts are electrically isolated from one another, and in a second contacting state the first and second contacts are electrically connected to one another. The measuring device includes an acoustic signal transmitter for transmitting an acoustic signal into the first contact, and a signal receiver connected to the second contact in a sound-conducting manner.

16 Claims, 4 Drawing Sheets

(56) References Cited

U.S. PATENT DOCUMENTS

| | | | |
|---|---|---|---|
| 2002/0158728 A1* | 10/2002 | Fenner | G01N 29/11 |
| | | | 335/132 |
| 2005/0237064 A1 | 10/2005 | Kwark | |
| 2006/0254355 A1* | 11/2006 | Zhou | G01R 31/50 |
| | | | 73/579 |
| 2011/0227871 A1* | 9/2011 | Cannon | G06F 3/0393 |
| | | | 345/174 |
| 2013/0096853 A1 | 4/2013 | Mahalingam et al. | |
| 2013/0342292 A1 | 12/2013 | Choi et al. | |
| 2014/0191767 A1 | 7/2014 | Zhou et al. | |
| 2016/0153847 A1 | 6/2016 | May | |
| 2017/0176394 A1 | 6/2017 | Linder et al. | |
| 2020/0194191 A1 | 6/2020 | Ashtekar | |

FOREIGN PATENT DOCUMENTS

| | | |
|---|---|---|
| DE | 102010008159 A1 | 9/2011 |
| DE | 102014212132 A1 | 12/2015 |
| EP | 2315229 A1 | 4/2011 |
| JP | S5588988 A | 7/1980 |
| JP | S58156851 A | 9/1983 |
| JP | H3261879 A | 11/1991 |
| JP | H0961486 A | 3/1997 |
| JP | 2001242211 A | 9/2001 |
| JP | 2003153899 A | 5/2003 |
| JP | 2008093314 A | 4/2008 |
| JP | 201074938 A | 4/2010 |
| JP | 201389596 A | 5/2013 |
| JP | 201627560 A | 2/2016 |
| JP | 201966322 A | 4/2019 |
| WO | 9707568 A1 | 2/1997 |
| WO | 2011101086 A1 | 8/2011 |
| WO | 2013075765 A1 | 5/2013 |
| WO | 2014193004 A1 | 12/2014 |

OTHER PUBLICATIONS

Extended European Search Report, Application No. /21192378.4-1010, dated Feb. 4, 2022, 8 pages.

Examination Report in Indian, Application No. 202144037598, dated Apr. 11, 2022, 5 pages.

German Office Action, Application No. 102020122065.0, dated Apr. 10, 2022, 4 pages.

Japanese Office Action with English translation, Application No. 2021-13370, dated Aug. 2, 2022, 7 pages.

Chinese First Office Action dated Jun. 29, 2023 with English translation, corresponding to Application No. 202110959226.4, 25 pages.

Korean Office Action dated Jul. 14, 2023 with English translation, corresponding to Application No. 10-2021-0110109, 18 pages.

Korean Office Action dated Jan. 2, 2024, corresponding to Application No. 10-2021-0110109, 6 pages.

* cited by examiner

CONTACT ARRANGEMENT HAVING A MEASURING DEVICE FOR DETERMINING A CONTACTING STATE OF THE CONTACT ARRANGEMENT BY MEANS OF AN ACOUSTIC SIGNAL

CROSS-REFERENCE TO RELATED APPLICATIONS

This application claims the benefit of Patent Application No. DE 10 2020 122 065.0 filed on Aug. 24, 2020, the whole disclosure of which is incorporated herein by reference.

FIELD OF THE INVENTION

The present invention relates to a contact arrangement having a measuring device and to a method for measuring a contacting state, in particular a contact arrangement for the high-voltage and/or high-current range.

BACKGROUND

Electrical contacts or electrical switches contact arrangements typically have two contacts which are electrically conductively connected to each other in a closed position and electrically isolated from each other in an isolated position. The contact arrangements can comprise a detector for determining whether the contacts are isolated or closed. According to the prior art, however, the contacting state is only measured indirectly via the position of an actuating element. As a result, for a state of failure in which, for example, one of the contacts is welded to the contact bridge cannot be detected or falsely declared as open or closed. Consequently, such contact arrangements are unsafe. Detectors registering changes in the electric and/or magnetic field are mostly also dependent on the level and type of the switched voltage, and therefore cannot be used arbitrarily for different contact arrangements.

Accordingly, there is a need for improved contact arrangements and measuring devices which can detect the contacting state of two contacts more reliably and in a versatile manner.

SUMMARY

According to an embodiment of the present disclosure a contact arrangement includes a first electrical contact, a second electrical contact and a measuring device for determining a contacting state between the first and second contacts. In a first contacting state the first and second contacts are electrically isolated from one another, and in a second contacting state the first and second contacts are electrically connected to one another. The measuring device includes an acoustic signal transmitter for transmitting an acoustic signal into the first contact, and a signal receiver connected to the second contact in a sound-conducting manner.

BRIEF DESCRIPTION OF THE DRAWINGS

The invention will now be described by way of example with reference to the accompanying Figures, of which.

DETAILED DESCRIPTION OF THE EMBODIMENTS

Figure 2:
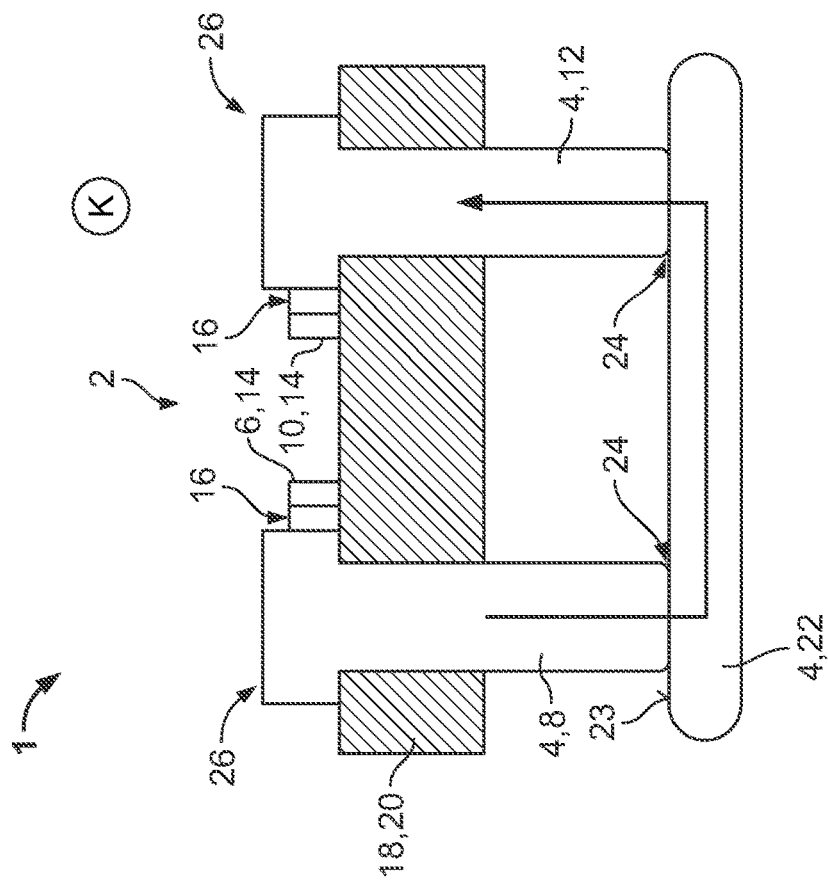
FIG. 2 is a schematic front view of the exemplary configuration of FIG. 1 in a second, closed contacting state.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
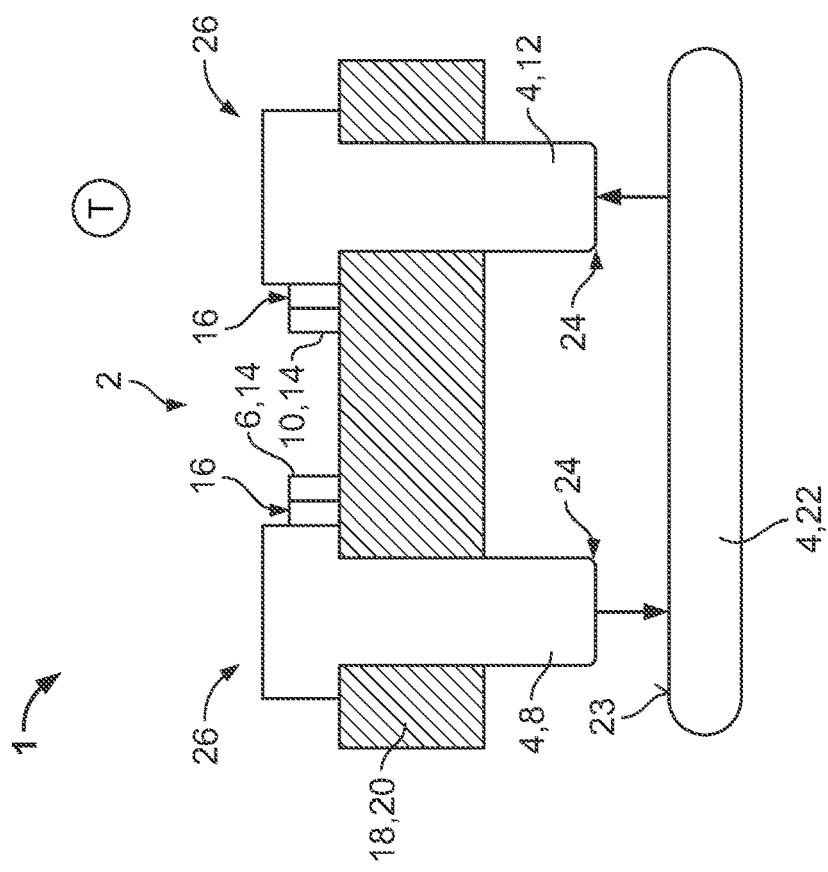
FIG. 1 is a schematic front view of an exemplary configuration of a contact arrangement according to the invention in a first, open contacting state.

FIGS. 1 and 2 show a first exemplary embodiment of a contact arrangement 1. The contact arrangement 1 includes a measuring device 2 for detecting a contacting state of the contact arrangement 1 and at least two electrical contacts 4, which are electrically isolated from one another in a first, open contacting state T (see FIG. 1) and are electrically connected to one another in a second, closed contacting state K (see FIG. 2). The measuring device 2 comprises an acoustic signal transmitter 6, which is adapted to couple an acoustic signal, in particular a sound wave, into a first contact 8 of the at least two contacts 4, and a signal receiver 10, which is connected to a second contact 12 of the at least two contacts 4 in a sound-conducting manner.

By coupling the signal transmitter 6 and the signal receiver 10 to different contacts of the contact arrangement, the sound wave can be transmitted directly via the contacts. The acoustic signal is conducted from the signal transmitter 6 to the signal receiver 10 via the structure-borne sound by the contacts 4 of the contact arrangement 1. As the acoustic signal, in contrast to a magnetic or electrical signal, is independent of the type and level of voltage, failures caused, for example, by light bridges, short circuits and/or welding can be reliably detected. Furthermore, the measuring device 2 and the method of operation thereof can be used in different contact arrangements without undue effort.

In one embodiment, the signal transmitter 6 and signal receiver 10 can be adapted to couple an acoustic signal in the ultrasonic range from about 16 kHz into the first contact 8 or to receive it from the second contact 12. For this purpose, signal transmitter 6 and signal receiver 10 are piezoelectric elements 14, with which a compact and low-wear measuring device 2 can be realized.

An electrical isolator 16, in particular a galvanic isolator, can be arranged between the signal transmitter 6 and the first contact 8 and between the signal receiver 10 and the second contact 12 to ensure reliable electrical isolation between the contacts and the signal transmitter or signal receiver. The electrical isolator 16 may, for example, be made of a ceramic material comprising at least a similar sound conduction as the material of the electrical contacts 4. Consequently, the acoustic signal can be coupled from the signal transmitter 6 into the first contact 8 via the electrical isolator 16, or the acoustic signal can be received by the signal receiver 10 from the second contact 12 via the electrical isolator 16, without any significant or unidentifiable fluctuations in its parameters.

As can be seen in FIGS. 1 and 2, first contact 8 and second contact 12 may be held stationary in the contact arrangement 1. The first and second contacts 8, 12 may be held on a common carrier 18, for example a housing wall. The carrier 18 may serve as a damping element 20, which has a lower acoustic conductivity than the material of the contacts 4. Thus, in the open state T, the acoustic signal may be transmitted between the first and second contacts 8, 12 via the damping element 20, thereby verifying that the measuring device 2 is ready for operation.

For opening or closing the electrical contacts 4, in particular the first and second contacts 8, 12, a further electrical contact 4 serving as a bridging contact 22 can be provided. The bridging contact 22 can be held movably relative to the first and second contacts 8, 12, wherein the bridging contact 22 comprises an abutment surface 23 facing the respective first and second contacts 8, 12, which abutment surface is spaced apart from at least one of the first and second contacts 8, 12 in the open contacting state T, and abuts a respective contacting end 24 of the first and second contacts 8, 12 in the closed contacting state K. Consequently, not only is the transmission of the electric current via the bridging contact 22 ensured, but also the transmission of the structure-borne sound.

More specifically, when the first and second contacts 8, 12 are connected to each other, a continuous path for the propagation of the structure-borne sound from the signal transmitter 6 to the signal receiver 10 is ensured. Therefore, in the closed contacting state K, the sound wave can be conducted from the signal transmitter 6 to the signal receiver 10 with the least resistance. However, if the closed contacting state K is changed (i.e., to the open contacting state T) by moving the bridging contact 22 away from at least one of the first and second contacts 8, 12, an air bridge is created between the contacting end 24 and the abutment surface 23. The air bridge or gap creates a damping effect on the sound wave, particularly in the ultrasonic range. Furthermore, the distance the sound wave has to travel to get from the signal transmitter to the signal receiver is increased. Each of these characteristics may be identified in the received acoustic signals, and thus used to identify the open contacting state T.

Signal transmitter 6 and/or signal receiver 10 can preferably be arranged at an end 26 of the respective contact 8, 12 facing away from the contacting end 24 so that the acoustic signal propagates directionally over the entire contact, thereby reducing or eliminating measurement errors.

In other embodiments, the contact arrangement 1 may also comprise two contacts which are movable relative to each other and which directly abut against each other in the closed contacting state K. The contact arrangement 1 can be part of an electrical switching device 27. Furthermore, a retrofit kit according to an embodiment of the present disclosure may comprise a measuring device 2 which can be integrated in a contact arrangement comprising at least two contacts.

The measuring device 2 may be adapted to output a representative signal for at least one of the parameters of running time, sound pressure, sound energy or sound intensity. According to this exemplary configuration, the measuring device 2 may be adapted to output a measurement signal representative of the acoustic intensity and a measurement signal representative of the running time of the acoustic signal. As the sound intensity can be dampened by air or a contact-inhibiting layer of dirt located between the abutment surface 23 and the contacting end 24, it is possible to detect whether or not electrical contacting is taking place by analyzing the measurement signal representative of the sound intensity.

The measurement of the running time of the acoustic signal can be associated with the zero crossings (i.e. the phase change) of the acoustic signal. Consequently, the zero crossing of the acoustic signal at the signal transmitter 6 may be considered the starting point and the zero crossing of the acoustic signal at the signal receiver 10 may be considered the end point. This is method may be preferred, as the phase change of the acoustic signal is less influenced by disturbances, for example, sound reflection, in contrast to the other sound parameters. As the running time of the acoustic signal is proportional to the travel path of the acoustic signal, the distance between the contacts 4, which are adapted to abut directly against each other, can be determined when analyzing the measurement signal representative of the running time.

By combining the two measurement signals (i.e., acoustic intensity and running time), failures can be avoided or at least detected. For example, the onset of levitation between the contacts can be detected at high short-circuit currents, which can cause arcing resulting in two contacts welding together.

The measurement can preferably take place continuously, such that changes in the contacting state can be detected at any time. However, if continuous operation of the measuring device is to be avoided, the measurement can also take place in a pulsed or periodic manner, for example as a function of a switching signal.

Figure 3:
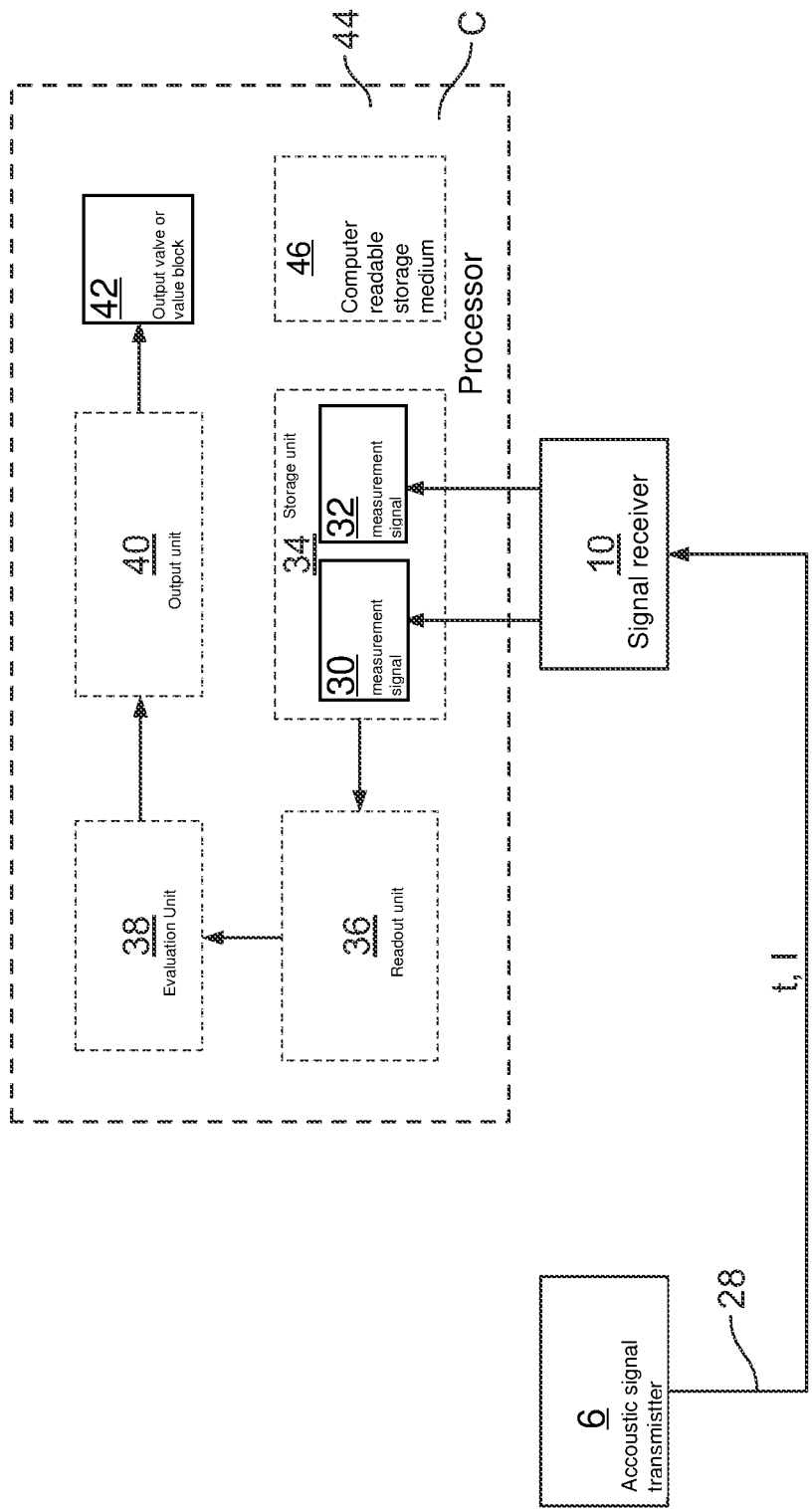
FIG. 3 is a schematic sketch of a block diagram of an exemplary configuration of a contact arrangement according to the invention.

FIG. 3 is a schematic sketch of a block diagram of an exemplary configuration of a measuring device. According to a computer-implemented method, at least one of the two measurement signals can be read out and the contacting state of the contact arrangement can be determined on the basis of its measurement parameter (e.g., intensity or amplitude, and running time). Specifically, the block diagram shows the signal transmitter 6, which couples the acoustic signal 28 to the first contact, and the signal receiver 10, which receives the acoustic signal 28 with a sound intensity I and after a running time t. Based on the acoustic signal 28 received by the signal receiver 10, a measurement signal 30 representative of the sound intensity I of the acoustic signal 28 and a measurement signal 32 representative of the running time t of the acoustic signal 28 can be output by the receiver.

These measurement signals 30, 32 can be stored on a storage unit 34, for example, a computer readable memory device (e.g., hard drive, random access memory and the like). The storage unit 34 can be integrated in a computer system C comprising at least one microprocessor responsive to associated program instructions stored on the storage unit, or at least can be read out by a computer system C. For this purpose, the computer system C may have a readout unit 36 which may include a readout processor and/or a set of readout instructions, which can access the measurement signals 30, 32 stored on the storage unit 34.

The read out measurement signals 30, 32 can be evaluated via an evaluation unit 38, which may include an evaluation processor and/or a set of evaluating instructions, and the corresponding contacting state can be determined. The evaluation unit 38 can be coupled to an output unit 40 (e.g., an output processor and/or a set of output instructions) which outputs the contacting state and/or the distance between two contacts which abut against each other at least in the closed contacting state in the form of an output value or value block 42. The output value block 42 may represent an output value indicative of the contact state and/or a physical input/output interface of the computer system C.

In particular, the computer system C may be a data processing system and comprises at least one processor 44 configured to execute instructions associated with each of the readout unit 36, the evaluation unit 38 and the output unit 40. In other embodiments, as set forth above, one or more of the units 36, 38, 40 may comprise an independent processor for executing the computer-implemented method described herein.

The commands or instructions for executing the method by the one or more processors of the computer system C may be stored on a computer-readable storage medium 46 (e.g., a memory device such as RAM or ROM) separate from the storage unit 34.

The computer system can be integrated in the contact arrangement 1 or may be arranged separately therefrom. If the computer system C is decoupled or separate from the contact arrangement 1, a connection (e.g., wired or wireless) can be provided via which the measurement signals can be accessed. The computer system C may also include a command unit (e.g., a button embodied as part of the input/output interface or output value block 42) that may be operatively coupled to the signal transmitter 6 for initiating the signal transmitter to couple or transmit the acoustic signal into the first contact 8.

Figure 4:
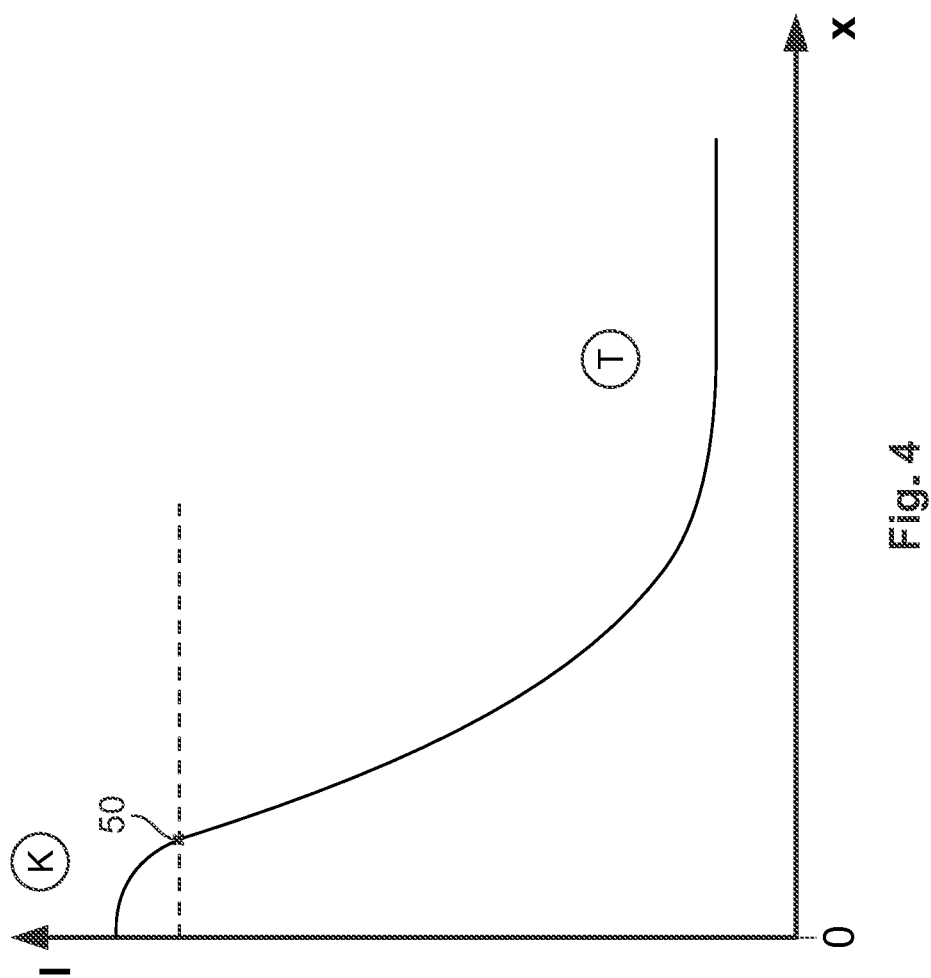
FIG. 4 is a schematic sketch of the course of the sound intensity with increasing distance between the contacts to be contacted.

Referring now to FIG. 4, an exemplary diagram shows a trace of a sound intensity signal as a function of the contacting distance. In the diagram, the sound intensity I is on the ordinate or vertical axis and the distance x of the contacts to be contacted is on the abscissa or horizontal axis. At a contact distance of 0 (i.e., when the contacts abut each other), the sound intensity of the acoustic signal at the signal receiver reaches its maximum. If the contacts are moved away or separated from each other, the sound intensity decreases continuously due to the widening air bridge between the contacts. The contacting state is changed from closed K to open T when the value falls below a threshold value 50. The threshold value 50 is only schematically drawn in the diagram and can vary depending on the contact arrangement. The threshold value 50 can, for example, be stored in the system (e.g., in the storage medium 46) by means of calibration and represent the value at which no current flow occurs between the contacts to be contacted. Consequently, for any value of sound intensity I above the threshold 50, an output value representative of the closed contacting state K can be output. In this way, the processor 44 is operative with the stored programming instructions for performing the steps of evaluating or measuring one or more signal characteristics, and comparing the measured signal characteristics to one or more predetermined values.

Figure 5:
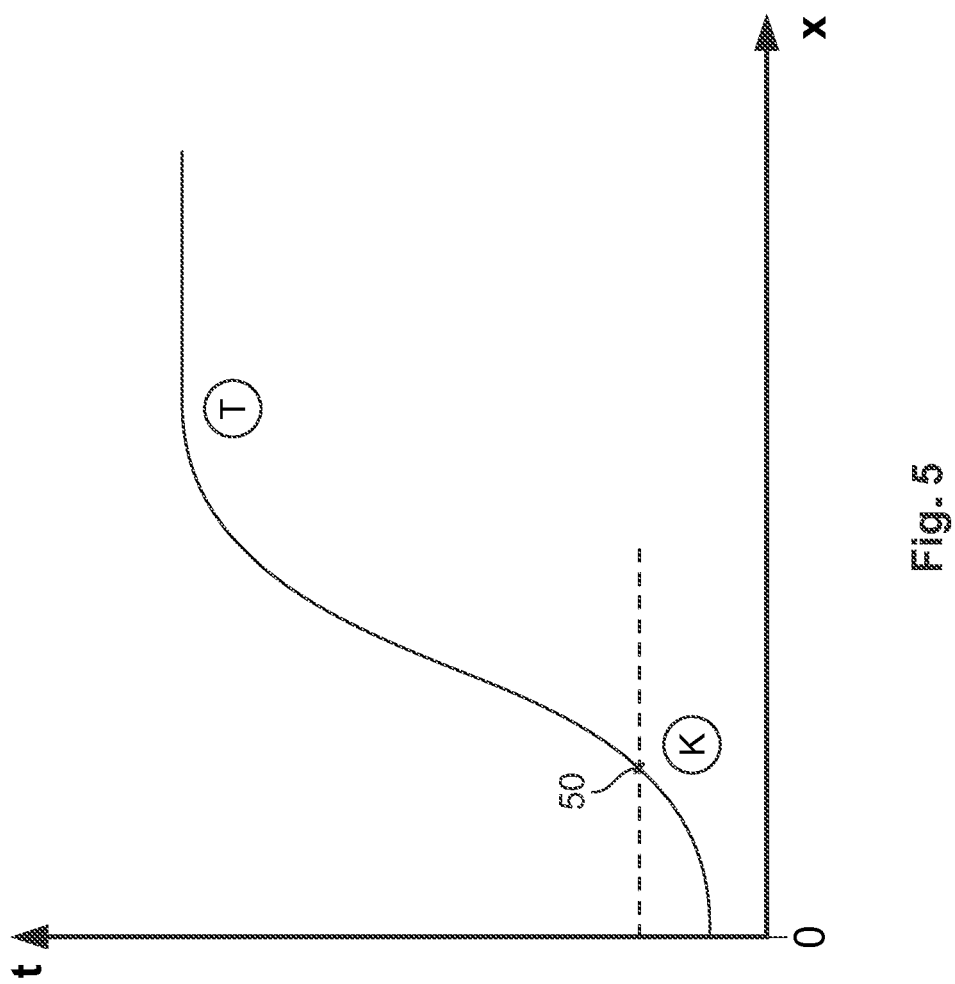
FIG. 5 is a schematic sketch of the course of the running time with increasing distance between the contacts to be contacted.

For an analysis of the exact distance between the contacts, the consideration of the sound intensity is less suitable, as this parameter is subject to additional fluctuations by the reflection and the like. If an output indicative of an exact distance between the contacts is to be output, a consideration or analysis of the running time signal is better suited, as it is subject to smaller fluctuations in comparison to the remaining sound quantities, and can be combined simply with the sound intensity. A diagram showing the trace of a signal running time t as a function of the contacting distance x is shown in FIG. 5. As set forth above, a threshold value 50 can be specified, with any value below the threshold value 50 indicating a closed contacting state K, and any value above the threshold value 50 indicating an open contacting state T.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A contact arrangement, comprising:
    a first electrical contact;
    a second electrical contact; and
    a measuring device for determining a contacting state between the first and second contacts, in a first contacting state the first and second contacts are electrically isolated from one another and in a second contacting state the first and second contacts are electrically connected to one another, the measuring device including:
        an acoustic signal transmitter for transmitting an acoustic signal into the first contact, the measuring device outputs a measurement signal representative of at least one of the parameters of running time, sound pressure, sound energy or sound intensity of the acoustic signal; and
        a signal receiver connected to the second contact in a sound-conducting manner, the measuring device outputs a first measurement signal representative of the sound intensity of the acoustic signal and a second measurement signal representative of the running time of the acoustic signal; and
    a processing unit includes at least one processor and a memory device, the processor responsive to a set of instructions stored on the memory device and adapted to:
        determine the contacting state between the first and second contacts according to at least one of the first measurement signal and the second measurement signal; and
        output an indication of the determined contacting state, the processing unit adapted to measure a running time of the second measurement signal, the running time being proportional to a travel path of the acoustic signal, associated with a zero crossing, output an indication of a determined distance between the first contact and the second contact according to the measured signal of the running time.

2. The contact arrangement of claim 1, wherein the acoustic signal transmitter transmits an acoustic signal in the ultrasonic frequency range.

3. The contact arrangement of claim 1, further comprising an electrically isolating damping element extending between the first and second contacts in at least the first contacting state.

4. The contact arrangement of claim 1, further comprising a bridge contact movable relative to at least one of the first contact or the second contact and by which the first contact and the second contact are electrically connected to one another in the second contacting state.

5. The contact arrangement of claim 4, wherein at least one of the signal transmitter or the signal receiver is arranged at an end of the respective first contact or second contact opposite an end of the contact which contacts the bridge in the second contacting state.

6. The contact arrangement of claim 1, further comprising an electrical isolator arranged between each of the signal transmitter and the first contact and the signal receiver and the second contact, the electric isolators passing the acoustic signal from the signal transmitter into the first contact and from the second contact to the signal receiver, respectively.

7. The contact arrangement of claim 6, wherein the electrical isolators are galvanic isolators formed of ceramic material.

8. The contact arrangement of claim 1, wherein the processor is further adapted to:
measure a sound intensity of the first measurement signal;
compare the measured sound intensity to a predetermined threshold value;
output an indication of the first contacting state if the measured sound intensity is below the predetermined threshold value; and
output an indication of the second contacting state if the measured sound intensity is above the predetermined threshold value.

9. The contact arrangement of claim 1, wherein the processor is further adapted to:
measure a running time of the second measurement signal, the running time being proportional to a travel path of the acoustic signal, associated with a zero crossing;
compare the measured running time to a predetermined value;
output an indication of the first contacting state if the measured running time is above the predetermined threshold value; and
output an indication of the second contacting state if the measured running time is below the predetermined threshold value.

10. A method for measuring a contacting state of a contact arrangement having at least two electrical contacts which are electrically isolated from each other in a first contacting state and electrically connected to each other in a second contacting state, comprising the steps of:
with a transmitter, transmitting an acoustic signal into a first electrical contact of the at least two electrical contacts; and
with a receiver, receiving the acoustic signal at a second electrical contact of the at least two electrical contacts, with the receiver, outputting a first measurement signal representative of the sound intensity of the acoustic signal; and
with the receiver, outputting a second measurement signal representative of the running time of the acoustic signal; and
with a processing unit, outputting an indication of a determined distance between the first contact and the second contact measuring a running time of the second measurement signal, the running time being proportional to a travel path of the acoustic signal, associating with a zero crossing; and
determining a distance between the first contact and the second contact according to the measured signal of the running time.

11. The method of claim 10, wherein the acoustic signal is continuously transmitted into the first electrical contact.

12. The method of claim 10, wherein the acoustic signal is transmitted into the first electrical contact in response to a switching signal.

13. The method of claim 10, further comprising the steps of:
measuring a sound intensity of the first measurement signal;
comparing the measured sound intensity to a predetermined threshold value;
outputting an indication of the first contacting state if the measured sound intensity is below the predetermined threshold value; and
outputting an indication of the second contacting state if the measured sound intensity is above the predetermined threshold value.

14. The method of claim 10, further comprising the steps of:
measuring a running time of the second measurement signal, the running time being proportional to a travel path of the acoustic signal, associating with a zero crossing;
comparing the measured running time to a predetermined value;
outputting an indication of the first contacting state if the measured running time is above the predetermined threshold value; and
outputting an indication of the second contacting state if the measured running time is below the predetermined threshold value.

15. A contact arrangement, comprising:
a first electrical contact;
a second electrical contact; and
a measuring device for determining a contacting state between the first and second contacts, in a first contacting state the first and second contacts are electrically isolated from one another and in a second contacting state the first and second contacts are electrically connected to one another, the measuring device including:
an acoustic signal transmitter for transmitting an acoustic signal into the first contact, the measuring device outputs a measurement signal representative of at least one of the parameters of running time, sound pressure, sound energy or sound intensity of the acoustic signal, the measuring device outputs a first measurement signal representative of the sound intensity of the acoustic signal and a second measurement signal representative of the running time of the acoustic signal; and a signal receiver connected to the second contact in a sound-conducting manner; and a processing unit, the processing unit includes at least one processor and a memory device, the processor responsive to a set of instructions stored on the memory device and adapted to:

determine the contacting state between the first and second contacts according to at least one of the first measurement signal and the second measurement signal; and output an indication of the determined contacting state, the processing unit adapted to output an indication of a determined distance between the first contact and the second contact and measure a running time of the second measurement signal, the running time being proportional to a travel path of the acoustic signal, associated with a zero crossing;

compare the measured running time to a predetermined value;

output an indication of the first contacting state if the measured running time is above the predetermined threshold value; and output an indication of the second contacting state if the measured running time is below the predetermined threshold value.

16. A method for measuring a contacting state of a contact arrangement having at least two electrical contacts which are electrically isolated from each other in a first contacting state and electrically connected to each other in a second contacting state, comprising the steps of:

with a transmitter, transmitting an acoustic signal into a first electrical contact of the at least two electrical contacts; and with a receiver, receiving the acoustic signal at a second electrical contact of the at least two electrical contacts;

with the receiver, outputting a first measurement signal representative of the sound intensity of the acoustic signal; and with the receiver, outputting a second measurement signal representative of the running time of the acoustic signal;

with a processing unit, outputting an indication of a determined distance between the first contact and the second contact, measuring a running time of the second measurement signal, the running time being proportional to a travel path of the acoustic signal, associating with a zero crossing; comparing the measured running time to a predetermined value;

outputting an indication of the first contacting state if the measured running time is above the predetermined threshold value; and outputting an indication of the second contacting state if the measured running time is below the predetermined threshold value.

* * * * *